United States Patent [19]

White et al.

[11] Patent Number: 4,618,565

[45] Date of Patent: Oct. 21, 1986

[54] ABSORPTIVE LAYER FOR OPTICAL LITHOGRAPHY

[75] Inventors: Lawrence K. White, W. Windsor Township, Mercer County; Nancy A. Miszkowski; Aaron W. Levine, both of Lawrenceville Township, Mercer County, all of N.J.

[73] Assignee: RCA Corporation, Princeton, N.J.

[21] Appl. No.: 741,358

[22] Filed: Jun. 5, 1985

[51] Int. Cl.$^4$ .................. G03C 5/16; G03C 1/84; G03C 1/76

[52] U.S. Cl. .................. 430/271; 430/311; 430/325; 430/519; 430/313; 430/323; 430/326; 430/327; 430/510; 430/512; 430/517; 430/166; 156/643

[58] Field of Search .............. 430/311, 325, 519, 271, 430/313, 323, 326, 327, 510, 512, 517, 166; 156/643

[56] References Cited

U.S. PATENT DOCUMENTS

| | | | |
|---|---|---|---|
| 4,238,559 | 12/1980 | Feng et al. | 430/156 |
| 4,244,777 | 1/1981 | Gupta | 162/6 |
| 4,362,809 | 12/1982 | Chen et al. | 430/312 |
| 4,370,405 | 1/1983 | O'Toole et al. | 430/312 |
| 4,535,053 | 8/1985 | West et al. | 430/512 X |

FOREIGN PATENT DOCUMENTS 3620 1/1985 Japan .................. 430/272

OTHER PUBLICATIONS

Ong and Hu, "Multilayer Resists for Fine Line Optical Lithography", *Solid State Technology*, Jun. 1984, pp. 155-160.
IEDM Technical Digest, pp. 554-557, 1983-Hillis et al.
Bartlett et al., SPIE, vol. 394, pp. 1-8, Mar. 1983.
Meyerhofer et al., SPIE, vol. 469, pp. 11-15, 1984.
Colour Index, Second Edition, 1956, vol. 2, pp. 2005 and 2008.

*Primary Examiner*—John E. Kittle
*Assistant Examiner*—Cynthia Hamilton
*Attorney, Agent, or Firm*—B. E. Morris; R. H. Swope

[57] ABSTRACT

Multilayer photoresist recording media containing an absorptive layer are improved by forming the absorptive layer from a composition comprising PMMA or a copolymer of methylmethacrylate and methacrylic acid, certain dyes such as hydroxyazobenzoic acid or Sudan Orange G and a suitable solvent. The dyes are insoluble in the solvent of an overlying photoresist layer. The media are substantially free of loss of resolution due to dissolution of the dye into the photoresist layer.

11 Claims, No Drawings

ABSORPTIVE LAYER FOR OPTICAL LITHOGRAPHY

This invention pertains to an improved composition for forming a light-absorptive layer in a multilayer resist recording medium.

BACKGROUND OF THE INVENTION

Two-and three-layer resist recording media and their use in forming patterned layers on a substrate are known. Such media generally are comprised of a base or planarizing layer and a patterning or photoresist layer. In a tri-layer recording medium, these layers are separated by an intermediate layer, generally an inorganic oxide or nitride, which functions as a hardmask. The intermediate layer may have functions other than as a hardmask, e.g. as an absorptive layer.

The incorporation of a dye into the base layer of a two-layer resist recording medium is disclosed, for example, in U.S. Pat. No. 4,362,809, issued Dec. 7, 1982. The incorporation of a dye into the base layer of a three-layer resist recording medium including a hardmask is disclosed in U.S. Pat. No. 4,370,405, issued Jan. 25, 1983. In each instance, the dye is present to prevent a loss of resolution by absorbing the light utilized to pattern irradiate the photoresist layer and thereby prevent light from reflecting from the substrate into nonirradiated portions of the photoresist layer.

A significant problem encountered heretofore in such recording media is that, where the absorptive layer containing the dye contacts the photoresist layer, the dye becomes dissolved in the solvent for the photoresist layer and is taken up therein. This occurs because both layers are frequently positive photoresist materials and, therefore, have the same or similar solvents. The dissolution of the dye by the photoresist layer causes the photoresist layer to become nonuniform and to have a highly variable response to the irradiating light. A solution to this problem has been found in accordance with this invention.

SUMMARY OF THE INVENTION

A composition suitable for forming an absorptive layer in a multilayer resist recording medium comprises a solution of a resin of poly(methylmethacrylate) or a copolymer of methylmethacrylate and methacrylic acid and a suitable dye which does not dissolve in the solvents conventionally utilized in positive photoresist compositions. Therefore, there is no dye uptake by the photoresist composition when it is applied to the absorptive layer.

DETAILED DESCRIPTION OF THE INVENTION

The compositions of this invention are useful in forming an absorptive layer in a multilayer resist recording medium. An absorptive coating formed from the subject compositions is useful as a base layer having a photoresist layer thereover or as a thin intermediate layer between a base or planarizing layer and a photoresist layer. The particular advantage of absorptive layers formed from the subject compositions is not realized when they underlie a hardmask layer since the hardmask layer would substantially prevent the dye in conventional absorptive coatings from being absorbed into the overlying photoresist compositions.

The resin component of the subject compositions is poly(methylmethacrylate) (PMMA) having a molecular weight of from about 100,000 to 1,000,000, suitably about 345,000, or a copolymer of methylmethacrylate (MMA) and methacrylic acid (MA) wherein the weight ratio of MMA to MA is from about 85/15 to 99/1, suitably about 91.5/8.5. The molecular weight of the copolymer is from about 100,000 to 1,000,000, suitably about 300,000.

The dye component of the subject compositions must possess all of a list of critical properties. First, the dye must have a window of high absorption at the specific wavelengths used to irradiate the resist layer. Generally, this means that the dye should have high absorbance in the range 350 nm to 450 nm and be essentially transparent in the range 500 nm to 600 nm. The dye must be compatible with the materials which the subject layer contacts both in the substrate and in adjacent layers.

Further, the dye must be able to withstand temperatures necessary for the processing of the remainder of the medium, i.e. it must be stable up to a temperature of at least about 200° C., preferably up to about 300° C. It is particularly important that the dyes utilized in the subject compositions be substantially insoluble in the solvents conventionally utilized to form the positive photoresist top layer in a multilayer resist recording medium. Such resist solvents typically include, for example, ethylene glycol monomethyl ether acetate, n-butyl acetate, acetone, lower alchols and the like. Finally, the dyes utilized in the subject compositions must be soluble in those solvents which will dissolve the polymeric component of the subject absorptive layers, e.g. glacial acetic acid or N-methyl-2-pyrrolidinone. Suitable dyes for the subject compositions include Sudan Orange G, i.e., 1-phenylazo-2,4-dihydroxybenzene, hydroxyazobenzoic acid, Methyl Red, i.e. 2-[4-(dimethylamino)phenylazo]-benzoic acid, Stilbene yellow, carboxy- and hydroxy-substituted diazo dyes and hydroxy-substituted naphthoquinone dyes having the requisite absorption and solubility characteristics.

The subject compositions are applied to the substrate, suitably by spin-coating, and heated to from about 120° to 200° C. to remove the solvent. The thickness of the resulting absorptive layer is suitably between about 100 nm and 500 nm. Such layers would have optical densities of from about 0.5 to 1.5. For the formation of such layers, the subject compositions would contain from about 2 to about 6, preferably about 5, percent by weight of the polymer or copolymer and from about 1 to about 4, preferably from about 2.5 to 3, percent by weight of the solid dye when the solvent is glacial acetic acid. Utilizing N-methyl-2-pyrrolidinone as the solvent, the subject compositions suitably contain from about 8 to about 13, preferably about 10, percent by weight of the polymer and from about 2 to about 7, preferably about 5, percent by weight of the dye.

The subject compositions are not planarizing materials. In fact, the subject compositions produce a much more conformal coating than previously utilized spin-coated base layers. For this reason, the subject compositions may be applied directly over the substrate to form a thin absorptive layer or over a planarizing layer to prevent reflected light from reentering the photoresist layer. When coated directly onto the substrate, the absorptive layer formed from the subject compositions may be coated directly with the photoresist layer or with a planarizing layer followed by the photoresist layer.

The photoresist layer can be of any suitable photosensitive resist material. It is, of course, preferable that the optimum wavelength for irradiation of the resist layer be at or close to the maximum absorption of the dye in the subject absorptive layer. Although the photoresist may be either positive or negative working, positive is preferred. Suitable resists include, for example, novolak resin/diazoquinone sensitizer preparations such as OFPR 800 of Dynachem Corp., HPR 204 and HPR 206 of Hunt Chemical Company, EK 809 of Eastman Kodak Company, AZ 1470 and AZ 1450 J of the Shipley Company and the like. The photoresist layer may be applied by any conventional procedure, preferably by spin-coating. Because the solvent for the photoresist is a nonsolvent for the dye, substantially no dye is taken up by the photoresist composition when it is applied to the absorptive layer.

A portion of the photoresist layer is then conventionally irradiated with actinic radiation utilizing, e.g. a suitable mask. The irradiation dosage should be sufficient to insure that the selected portion of the photoresist is totally irradiated throughout its thickness. The photoresist is then wet developed to form a pattern. The exposed portion of the underlying subject absorptive layer is then developed, suitably in a dry oxygen plasma. This is accomplished with minimal loss of the photoresist pattern because the etch rate of the absorptive layers formed from the subject compositions is up to about five times that of most conventional photoresist composition in dry oxygen plasma. In addition, an effective absorptive layer may be formed from the subject compositions which is substantially thinner than conventional photoresist layers.

The improved absorptive layers provided in accordance with this invention are advantageous in that the dye component thereof remains within the layer and, therefore, does not cause a loss of resolution. Linewidth changes over reflective substrates have been observed to be less than 200 nm. The subject compositions also possess good stability and are unaffected by a wide processing latitude.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

The substrates for this example were silicon wafers three inches in diameter having epitaxial silicon islands 120 micrometers square and 0.5 micrometer in height. The wafers were coated with a 0.3 micrometer thick coating of highly reflective tantalum disilicide by cosputtering tantalum and polysilicon. Sufficient Sudan Orange G and a PMMA polymer having a molecular weight of about 345,000 were dissolved in 30 ml of glacial acetic acid to yield a 3 and 5 percent solution, respectively. The dye-containing solution was spin-coated onto six wafers, allowed to dry and then baked at 200° for 30 minutes to drive off the solvent. The resulting uniform absorptive layer was 250 nm thick.

A layer of the commercial photoresist OFPR 800 having a viscosity of 30 centipoise was spin-coated onto the absorptive layer to a thickness of 1.2 micrometer. The photoresist layer was allowed to air dry and then soft-baked on a hotplate at 105° for 60 seconds. The photoresist layer was irradiated with light at 405 nm with an Optimetrix 8010 stepper. The photoresist layer was wet developed using NMD-3 developer supplied by the manufacturer.

The wafers were placed into a conventional parallel plate reactive ion etcher. The absorptive layer was etched utilizing a dry oxygen plasma at 500 millitorr. A pattern of 1 micrometer lines and spaces was cleanly defined on the tantalum silicide coated substrates and topography. Microscopic examination of the photoresist structure showed no appreciable loss due to reflection from the surface of the tantalum silicide. The resist pattern was substantially free of the constrictions, conventionally termed "necking" or "notching", that often occur utilizing conventional resist systems where a line is defined over the edge of substrate topography. The linewidth deviation over topography utilizing the subject absorptive layers, on the average, was, less than 200 nm. There was no evidence under microscopic examination of absorption of the dye into the photoresist layer.

EXAMPLE 2

The procedure of Example 1 was repeated utilizing as the absorptive composition a solution of 5 percent of hydroxyazobenzoic acid and 10 percent of a methylmethacrylate/methacrylic acid copolymer (91.5/8.5), mol. wt. of about 300,000, in N-methyl-2-pyrrolidinone. The absorptive layer was 250 nm thick. Linewidth deviation over substrate topography, on the average, was less than 200 nm. There was no evidence under microscopic examination of absorption of the dye into the photoresist layer. These results clearly demonstrate the excellent dimensional control provided by the absorptive layers of this invention.

We claim:

1. A multilayer resist recording medium disposed on a substrate comprising a planarizing layer overlying the substrate, an absorptive layer overlying the planarizing layer and a photoresist layer overlying the absorptive layer, wherein the absorptive layer comprises poly(methylmethacrylate) or a copolymer of methylmethacrylate and methacrylic acid, and a dye that is absorptive at the light frequency used to irradiate the photoresist layer and that is insoluble in the solvent for the photoresist layer.

2. A recording medium in accordance with claim 1, wherein the molecular weight of poly(methylmethacrylate) is from about 100,000 to 1,000,000.

3. A recording medium in accordance with claim 1, wherein said copolymer has a weight ratio of from about 85/15 to 99/1 methylmethacrylate to methacrylic acid.

4. A recording medium in accordance with claim 1, wherein the dye is selected from the group consisting of 1-phenylazo-2,4-dihydroxybenzene, hydroxyazobenzoic acid, Methyl Red, Stilbene yellow, a carboxy-substituted diazo dye, a hydroxy-substituted diazo dye and a hydroxy-substituted naphthoquinone dye.

5. A recording medium in accordance with claim 4, wherein the dye is 1-phenylazo-2,4-dihydroxybenzene.

6. A recording medium in accordance with claim 4, wherein the dye is hydroxyazobenzoic acid.

7. A process for forming a relief pattern on a substrate comprising:
   (a) coating the substrate with a composition comprising poly(methylmethacrylate) or a copolymer of methylmethacrylate and methacrylic acid, a suitable dye and a solvent therefor;
(b) drying the coating to form an absorptive layer;
(c) applying thereover a coating of a photoresist composition comprising a light-sensitive resist material and a solvent therefor, the solvent being a nonsolvent for the dye so that substantially no dye is dissolved into the photoresist layer;
(d) drying said coating to form a photoresist layer;
(e) irradiating and developing the photoresist layer, thus exposing a portion of the absorptive layer; and
(f) plasma etching the exposed portion of the absorptive layer in an oxygen plasma, thus exposing a corresponding portion of the substrate.

8. A process in accordance with claim 7 wherein the solvent for the dye-containing composition is glacial acetic acid and the composition contains from about 2 to about 6 percent by weight of the polymer or copolymer and from about 1 to about 4 percent by weight of the dye.

9. A process in accordance with claim 7, wherein the solvent for the dye-containing composition is N-methyl-2-pyrrolidinone and the composition contains from about 8 to about 13 percent by weight of the polymer or copolymer and from about 2 to about 7 percent by weight of the dye.

10. A process in accordance with claim 7, wherein the light-sensitive material comprises a novolak resin and a diazoquinone sensitizer therefor.

11. A process in accordance with claim 9, wherein the dye-containing composition comprises a solution of hydroxyazobenzoic acid and a copolymer of methylmethacrylate and methacrylic acid in N-methyl-2-pyrrolidinone.

* * * * *